(12) United States Patent
Halpin

(10) Patent No.: US 6,572,924 B1
(45) Date of Patent: Jun. 3, 2003

(54) EXHAUST SYSTEM FOR VAPOR DEPOSITION REACTOR AND METHOD OF USING THE SAME

(75) Inventor: Michael W. Halpin, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 09/443,552

(22) Filed: Nov. 18, 1999

(51) Int. Cl.⁷ .................. C23C 16/44; C23C 16/455; C23C 16/54
(52) U.S. Cl. .............. 427/255.28; 427/248.1; 427/255.23; 118/715; 118/733; 55/417
(58) Field of Search .............. 427/248.1, 255.23, 427/255.28; 438/680, 758; 55/417, 410, 424, 425, 426, 427; 137/625, 625.45; 118/715, 733

(56) References Cited

U.S. PATENT DOCUMENTS

| | | | |
|---|---|---|---|
| 4,608,063 A | * 8/1986 | Kurokawa | 55/208 |
| 4,640,221 A | * 2/1987 | Barbee et al. | 118/689 |
| 4,793,283 A | * 12/1988 | Sarkozy | 118/725 |
| 4,828,224 A | * 5/1989 | Crabb et al. | 251/298 |
| 4,940,213 A | * 7/1990 | Ohmine et al. | 266/152 |
| 5,250,323 A | * 10/1993 | Miyazaki | 427/255.1 |
| 5,299,584 A | * 4/1994 | Miyazaki et al. | 134/56 R |
| 5,443,644 A | * 8/1995 | Ozawa | 118/715 |
| 5,578,132 A | 11/1996 | Yamaga et al. | |
| 5,641,358 A | * 6/1997 | Stewart | 118/715 |
| 5,704,214 A | 1/1998 | Fujikawa et al. | |
| 5,826,607 A | * 10/1998 | Knutson et al. | 137/1 |
| 5,925,167 A | * 7/1999 | Smith | 95/11 |
| 5,937,323 A | * 8/1999 | Orczyk et al. | 438/624 |
| 6,036,482 A | * 3/2000 | Okase | 432/11 |

FOREIGN PATENT DOCUMENTS

| | | |
|---|---|---|
| JP | 61 096728 A | 5/1986 |
| JP | 6 2020-875 | 1/1987 |
| JP | 6 2101-022 | 5/1987 |
| JP | 03 265596 A | 11/1991 |
| JP | 04 103767 A | 4/1992 |
| JP | 04280626 A | * 10/1992 |
| JP | 06 005520 A | 1/1994 |
| JP | 08031743 A | * 2/1996 |
| JP | 10-242063 A | * 9/1998 |

OTHER PUBLICATIONS

Mizuno, "Method and Equipment for Preventing Contamination of CVD System" Japanese Patent Abstracts, JP408031743A, Feb. 2, 1996.*

Nemoto, "Low Pressure Chemical Vapor Deposition Equipment" Japanese Patent Abstracts, JP410242063A, Sep. 11, 1998.*

Tanabe et al., "Vertical Diffusion Type CVD device" Japanese Patent Abstracts, JP404280626A, Oct. 6, 1992.*

* cited by examiner

Primary Examiner—Shrive P. Beck
Assistant Examiner—Wesley D. Markham
(74) Attorney, Agent, or Firm—Knobbe, Martens, Olson & Bear, LLP

(57) ABSTRACT

An improved exhaust conductance system for a CVD reactor includes two exhaust paths and a three-way valve controlling flow to the exhaust paths. The valve directs flow through a first exhaust conductance path when reactant gas passes through the reactor, and through a second exhaust conductance path after reactant gas has been purged from the chamber and only purging gas is flowing through the reactor.

11 Claims, 2 Drawing Sheets

EXHAUST SYSTEM FOR VAPOR DEPOSITION REACTOR AND METHOD OF USING THE SAME

BACKGROUND OF THE INVENTION

1. Field of the Invention

The present invention relates generally to the field of chemical vapor deposition and more specifically to an exhaust conductance system for a CVD fabrication reactor.

2. Description of the Related Art

Chemical vapor deposition relates generally to the process of passing a reactant gas over one or more substrates in order to deposit various materials thereon. This technique is commonly employed in the electronic arts as part of the process for fabricating semiconductor devices.

In the context of semiconductor fabrication, the substrate typically is a wafer approximately 50 to 300 millimeter in diameter. A wafer handler places one or more wafers in a reaction chamber through a gate valve, which is then closed. A reactant gas, which contains particles and particle-generating compounds to be deposited onto the wafers, is introduced into the reaction chamber through a separate passage. As the reactant gas passes over the wafers, the particular chemical compounds in the gas adhere to the surface of the wafers as a result of a thermal reaction or decomposition of the various gaseous materials.

After passing through the reaction chamber, the reactant gas exits the chamber through an exhaust conductance path. The exhaust conductance path typically leads to a scrubber or other device that prepares the reactant gas for proper disposal. As the reactant gas travels down the exhaust conductance path towards the scrubber, the chemical compounds in the reactant gas adhere to the walls of the conductance path, thus contaminating the system.

Upon completion of the deposition process, a purging gas is introduced into the reaction chamber at one or more sites in order to expel the reactant gas from the chamber. Typical purging gases are hydrogen, nitrogen, helium, or argon. Like the reactant gas, the purging gas travels through the reaction chamber and exits through the exhaust conductance path to the scrubber. Unlike the reactant gas, however, the purging gas does not deposit chemical compounds on the walls of the exhaust conductance path and, thus, does not contaminate the system.

After the reaction chamber has been purged, the gate valve is opened, and the deposited wafers are removed and replaced with undeposited wafers. The gate valve is then closed, and a new cycle of the chemical vapor deposition process commences.

In order to obtain commercially viable wafers, it is critical to control the thickness of the deposition layer. Ideally, the chemical compounds in the reactant gas would be deposited in a uniform thickness across the entire surface of each wafer. Several factors work against achieving this desired result, however. For example, as the reactant gas deposits onto the wafers, the concentration of the material to be deposited changes, resulting in a thinner deposition layer further down the reaction chamber. Similarly, variances in temperature at different locations within the reaction chamber cause the reactant gas to deposit onto the wafers at different rates. Furthermore, contamination within the reaction chamber leads to the adherence of unwanted particles to the surface of the wafers.

Improvements have been made in the field of chemical vapor deposition to correct the problems associated with variances in the concentration of chemical compounds in the reactant gas and variances in temperature within the chamber. Few improvements have been made, however, that effectively overcome the problems associated with contamination.

Contamination of the wafers may occur, for instance, if sudden changes in pressure within the semiconductor fabrication reactor cause particles to shear loose from the inner surface of the exhaust conductance path. These pressure pulses may occur when the hermetically sealed valve separating the reaction chamber from the wafer handler is opened, or when the reactor is activated or deactivated. Particles adhering to the inner surface of the exhaust conductance path also may shear loose under the force of the venting gas passing through the exhaust conductance path. Furthermore, vibrations from the reaction chamber or some external force may cause the particles to break loose. The detached particles then may travel upstream back towards the reaction chamber, via viscous flow, and ultimately contaminate the wafers.

Thus, there is a need in the field of chemical vapor deposition and semiconductor fabrication reactors for an improvement to correct contamination of wafers caused by particles adhering to the inner surface of traditional exhaust conductance paths.

SUMMARY OF THE INVENTION

The present invention is directed towards an improved exhaust conductance system for a semiconductor fabrication reactor that reduces the extent of contamination of wafers processed therein. A preferred embodiment of the exhaust conductance system of the present invention comprises two separate exhaust conductance paths selectable by way of a three-way valve. One of the exhaust conductance paths vents reactant gas (or any gas that adheres to the inner surface of the conductance path). The other exhaust conductance path vents purging gas (or any noncontaminating gas). The three-way valve allows for selection of the reactant gas exhaust conductance path during the processing and etching phases of the deposition cycle and selection of the purging gas exhaust conductance path during most other phases of the cycle. Because the latter, cleaner path can be selected during those phases of the cycle when the system is susceptible to pressure pulses, gas flow forces, or other forces likely to shear loose any particles adhering to the inner surface of the exhaust conductance path, there is less likelihood that particles will flow back into the reaction chamber and contaminate processed wafers or chamber walls.

The scope of the present invention is not limited to two exhaust conductance paths connected to the reaction chamber by a three-way valve. The present invention contemplates multiple exhaust conductance paths joined to the reaction chamber by appropriate valving. Use of more than one exhaust conductance path allows for the selection of separate paths for passage of contaminating and noncontaminating gases. Additional conductance paths may be included to provide for more specific separation of the gases.

The scope of the present invention also includes a method of using the improved exhaust conductance system. During the phases of the chemical vapor deposition cycle in which particles may form on the walls of the exhaust line the valve in the exhaust line is positioned so that the reaction chamber is open to the first or "dirty" exhaust conductance path, which is connected to the scrubber. Typically, this would include process, etch, and bake processing steps. Upon completion of the processing phase, the three-way valve is positioned so that the reaction chamber is open to the second or "clean" exhaust conductance path, and the "dirty" exhaust conductance path is closed. Purging gas is then introduced into the reaction chamber and exits through the clean exhaust path. After purging, the interior of the reaction chamber is accessed, and the deposited wafers are replaced with undeposited wafers. The path in the clean line is also left open during idle or any wafer cool down step.

Further features and advantages of the present invention will become apparent to those of skill in the art in view of the detailed description of preferred embodiments, which follows, when considered together with the attached drawings and claims.

DETAILED DESCRIPTION OF THE PREFERRED EMBODIMENT

Figure 1:
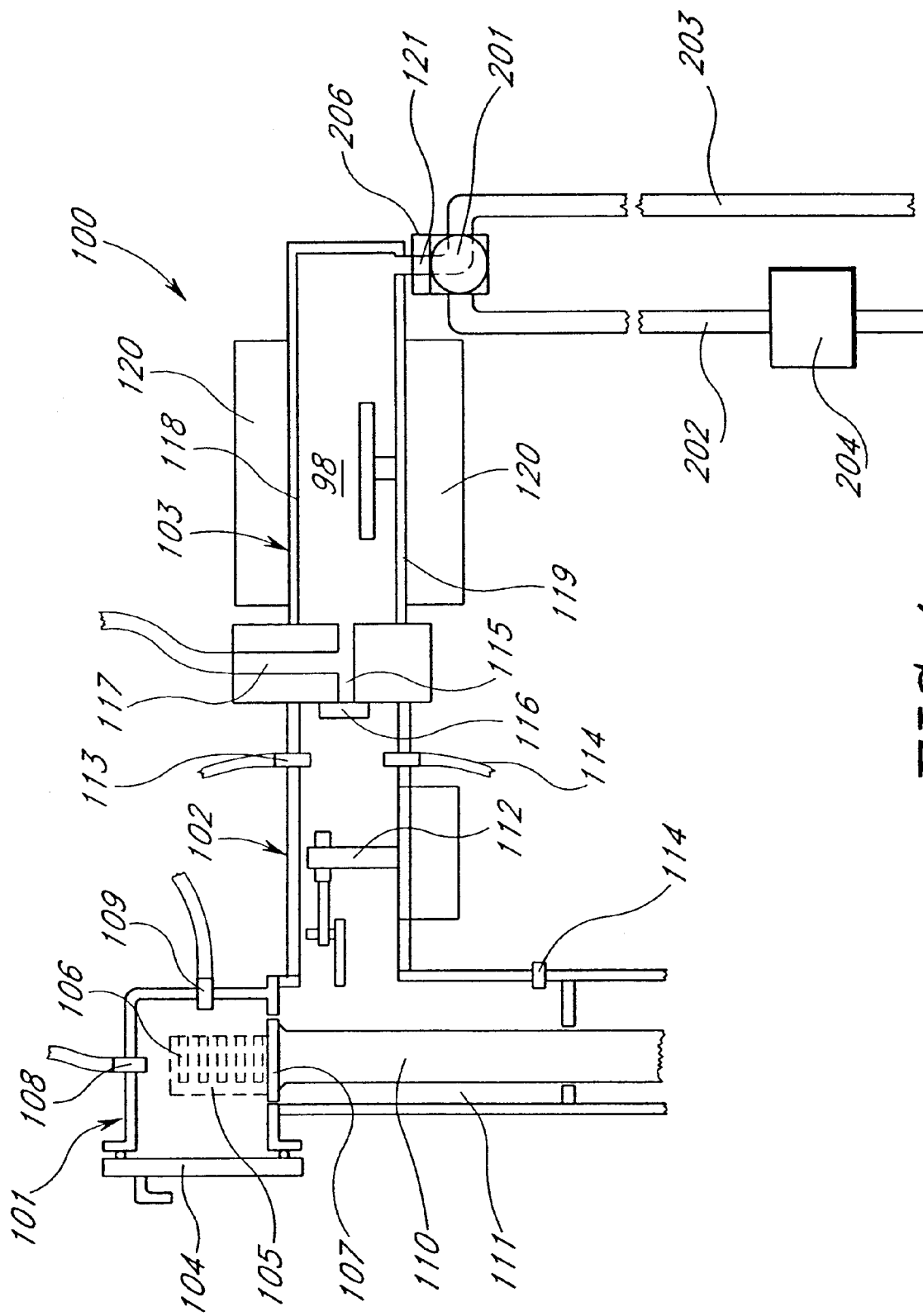
FIG. 1 shows a schematic representation of a preferred embodiment of the present invention incorporated into a CVD reactor.

FIG. 1 schematically illustrates the invention in a chemical vapor deposition system 100 described and disclosed in U.S. Pat. No. 4,828,224, which is incorporated herein by reference. Although FIG. 1 depicts one arrangement, any embodiment of the present invention can be used in conjunction with a variety of different deposition systems.

The chemical vapor deposition system 100 generally comprises three different subsystems: a substrate loading system 101, a handling system 102, and a processing system 103. The interior of the substrate loading system 101 is accessed by opening a hatch 104. A cassette 105 containing one or more substrates (or wafers) 106 is placed in the interior of the substrate loading system 101 on a platform 107. The substrate loading system 101 is then sealed by closing the hatch 104, and the interior is purged by a purging gas which enters through port 108 and exits through port 109.

After the interior of the substrate loading system 101 is properly purged, the platform 107 is lowered by an elevator 110 through elevator shaft 111. The cassette 105 is lowered to a position that allows a substrate handler 112, located in the substrate handling system 102, to access each individual substrate 106 from the cassette 105.

One or more inlet purge gas ports 113 and one or more outlet purge gas ports 114 are provided to remove any contamination lingering within the handling system 102 and the elevator shaft 110. The substrate handler 112 then loads a substrate 106 into the processing system chamber 98 through a channel 115. FIG. 1 depicts the channel 115 in a closed position, wherein a gate valve 116 has sealed the channel 115 from the handling system 102. Gate valve 116 is opened to allow the substrate handler 112 to load a substrate 106 into the processing system 103.

A gas inlet passage 117 is attached to channel 115. Once a substrate 106 is placed in the processing system 103 and the gate valve 116 is closed, a reactant gas is introduced into the chamber 98 through gas inlet passage 117. Above the upper surface 118 and below the lower surface 119, respectively, of the processing system 103 are heating elements 120, which heat the substrate in the chamber. Upon completion of the processing phase of a chemical vapor deposition cycle, purge gas is typically introduced into the processing chamber by way of the passage 117.

Reactant gas exits the chamber 98 through an exhaust gas outlet 121. In accordance with the invention, a three-way valve 201 is connected to the outlet and allowed to flow either, a first conductance path 202, or a second conductance path 203. The first path, which may be referred to as the dirty path, leads to a scrubber 204, which processes reactant gas prior to emission. The second conductance path 203, which might be termed the clean path, is to be used when the dirty path is not needed.

During those phases of the chemical vapor deposition cycle when particles might be depositing on the walls of the outlet 121, such as during processing, baking, and etching, the three-way valve 201 is positioned so that the gas vents through the dirty path 202, which leads to the scrubber 204. Stated differently, path 202 is utilized when "contaminating" gases are flowing. When purging gas is passing through the processing system 103 and contaminating gas has been removed, the three-way valve 201 may be moved to the clean path 203 in response to a controller 206.

The ability to select the appropriate conductance path, depending on whether reactant gas or purging gas is passing through the processing system 103, helps reduce the level of contamination within the chemical vapor deposition system 100. As reactant gas passes through the processing system 103, particles within the reactant gas adhere to the inner walls of the system, including the inner walls of the exhaust conductance path 202 through which the reactant gas is vented. Pressure pulses or other physical forces may later cause these particles to detach from the walls. Pressure differences within the chemical vapor deposition system 100 may cause these particles to reenter the processing system 103 through backflow, possibly contaminating any substrates 106 located therein. Thus, it is desirable to isolate this dirty path 202 through which reactant or contaminating gas passes.

As noted above, the wafer handling chamber is normally being purged to remove particles from the systems and to prevent them from entering the processing chamber. At the same time, the processing chamber is being vented through the exhaust outlet 121. When the gate valve 116 is opened to insert or remove a wafer from the chamber 98, the pressures in the wafer handling chamber and the processing chamber are typically balanced fairly closely, but with a slightly lower pressure in the process chamber to prevent particles from flowing into the handling chamber. Nevertheless, pressure fluctuations in the system cause particles in the exhaust line to flow upstream.

In those steps of the reaction process in which reactant gas is not passing through the processing system 103 (e.g., when purging gas is passing through the processing system 103, during substrate cool down, and during substrate transfer), the three-way valve 201 should be positioned so that only the cleaner, second conductance path 203 through which purging gas passes is opened to the processing system 103. Because reactant gas does not pass through the second conductance path 203, the inner walls of the second conductance path 203 are not contaminated with particles from the reactant gas. Thus, even if the cleaner path 203 is subjected to pressure pulses or other external forces, such force will not result in the release of particles from the inner surfaces of the second conductance path 203. Consequently, the potential contamination of the processing system 103 through gas backflow is reduced.

It is desirable to minimize the length of the gas outlet 121. Minimizing this distance will reduce the inner wall surface area that is susceptible to potential contamination. Increasing the distance between the valve and the chamber wall reduces the effectiveness of the invention. In a preferred embodiment, the three-way valve is attached directly to an outlet flange attached to the chamber wall.

There are of course a large variety of chemical vapor deposition processes, and thus the control of the exhaust paths should be determined by the particular process steps. In general, however, whenever the gases flowing through the chamber should be sent through a scrubber, the so-called dirty exhaust path should be selected. It may be helpful to consider a particular process, such as epitaxial deposition of silicon, in relation to the exhaust system. If a reactor is first starting up, nitrogen is typically being purged through the chamber. Thus, the three-way valve should be positioned by the controller 206 so that the gas flow is to the clean conductance path 203. Likewise the valve should remain in that position when the reactor is initially being heated, when the gate valve is opened to load a wafer into the reactor, and when the reactor is heated further.

If there is a so-called hydrogen bake step wherein the temperature is increased to about 1200° centigrade while hydrogen is flowing through the chamber, it may be desirable to direct the exhaust flow to the first path 202 connected to the scrubber 204, since that may produce contaminating gas flow. In some instances, the hydrogen bake step is followed by a hydrochloric acid (HCL) wafer etch step at an elevated temperature, and clearly at that time the exhaust valve should be open to the path leading to the scrubber. Because of etching activity and the corrosive effect of the gas. An HCL etch step is typically followed by a hydrogen purging step. It is recommended that the exhaust valve remain open to the path leading to the scrubber inasmuch as it is desirable to remove the HCL gases from the system. Typically, a deposition step would then occur, and the exhaust path should remain open to the scrubber. The deposition step is followed by a brief hydrogen purge step in which the deposition gases are being purged from the system.

Following that, hydrogen purge would continue while the wafer is cooling. The three-way valve should be open to the clean path 203 at that stage, and should remain in that position when the wafer is being unloaded and during a subsequent hydrogen purge step. Typically, it is then necessary to etch the susceptor and the chamber walls. During those steps, the dirty exhaust path 202 should be once more selected. Following that, there is normally a further hydrogen purge step. During at least the initial portion of that step in which etching gases are being removed, the valve should remain open to the dirty path. Following that, the valve can be once more switched to the clean path, and the cycle repeated with a further wafer loading step.

Figure 1A:
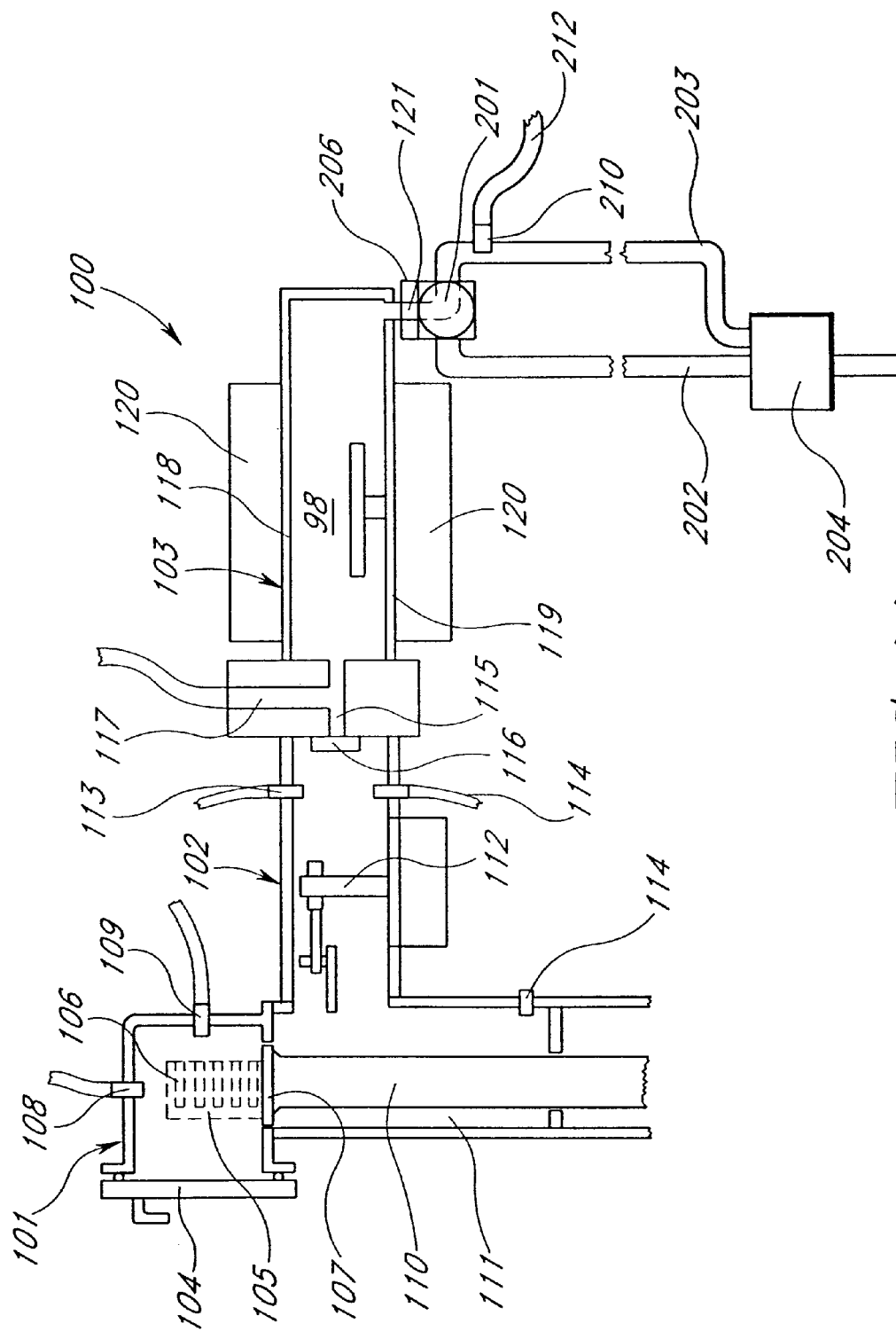
FIG. 1A schematically illustrates an option for the reactor of FIG. 1 in which all exhaust gas is scrubbed.

FIG. 1A illustrates a slight modification of the system of FIG. 1, wherein the clean path line 203 is shown connected to the scrubber 204. A valve 210 in the line 203 permits the exhaust gas to be divided from the path leading to the scrubber, and instead ducted to a conduit 212. For example, during a nitrogen purge, it might be desirable to bypass the scrubber.

While a particular embodiment of the invention has been disclosed, other variations are certainly within the scope of the invention. For example, although use of a three-way valve is preferred, a valve could be positioned at the entry to each of the two exhaust paths. Further, perhaps other flow control devices could be employed. Also, the invention may be useful in various systems in which alternate flow pathes are desired to prevent product or apparatus contamination.

What is claimed is:

1. A chemical vapor deposition system comprising:
    a substrate handling system including a handling chamber;
    a substrate processing system including a deposition chamber having one or more gas inlets for deposition gas or purge gas, and having an exhaust outlet;
    a gate valve controlling an opening into the deposition chamber through which a substrate is moved into or out of the deposition chamber from the handling chamber;
    one or more purge gas inlets and outlets connected to said handling chamber, configured to maintain a pressure balanced fairly closely with the pressure of the deposition chamber, but with the deposition chamber pressure being slightly less than that of the handling chamber when the gate valve is open so that particles in the deposition chamber do not flow into the handling chamber;
    a first exhaust conductance path connected to said exhaust outlet for conducting exhaust from the deposition chamber when deposition gas is flowing into the deposition chamber;
    a second exhaust conductance path connected to the exhaust outlet and separated from the first path so that particles from the first path cannot enter the deposition chamber through the second path;
    at least one exhaust valve connected to control the flow of gas from the exhaust outlet into either of said exhaust paths while the other path is closed, said exhaust valve being positioned to minimize the distance between the exhaust valve and the exhaust outlet to minimize the surfaces exposed to deposition gas before reaching the exhaust valve;
    a controller set to position said exhaust valve so that exhaust gases are directed to said fist path when deposition gases are being introduced into the deposition chamber through said gas inlet and said deposition gases are being purged front the chamber; and
    said controller being set to control the deposition chamber purge gas exhaust gas flow so that said at least one exhaust valve is positioned to direct flow into said second exhaust path and to prevent flow into said first path before said gate valve is opened so that if pressure fluctuations occur in the deposition chamber when the gate valve is opened, particles in the first conductance path are blocked from flowing upstream into the deposition chamber.

2. The system of claim 1, wherein said exhaust valve comprises a three-way valve which in one position directs flow into the first path while preventing flow into the second path, and in a second position permits flow into the second path while preventing flow into the first path.

3. The system of claim 1, in which a scrubber is connected to receive gas flowing through said first path.

4. The system of claim 1, wherein sad exhaust valve is mounted directly to said exhaust outlet.

5. A method of operating a CVD reactor having a substrate handling chamber and a reaction chamber, a gate valve between the two chambers through which a substrate is inserted into or removed from the reaction chamber, a purge gas inlet and outlet in said handling chamber, a gas inlet to the reaction chamber, an exhaust gas outlet from the reaction chamber, a first exhaust gas path from the reaction chamber, a second exhaust gas path from the reaction chamber completely separated from said first path, and at least one exhaust valve controlling a flow to one or the other of the exhaust paths, said method comprising the steps of:

flowing purge gas through the handling chamber;

positioning the exhaust valve so that the second path is open to the reaction chamber and the first path is closed to the reaction chamber;

introducing purging gas into the reaction chamber;

then opening the gate valve to provide access to the interior of the reaction chamber and inserting a substrate into the reaction chamber while maintaining the pressure in the reaction chamber slightly less than that of the handling chamber so that particles in the reaction chamber do not flow into the handling chamber;

closing the gate valve;

positioning the exhaust valve so that the first exhaust path is open to the reaction chamber and the second path is closed to the reaction chamber and then introducing deposition gas into the reaction chamber;

stopping the introduction of deposition gas and purging residual deposition gas from the reaction chamber;

after the purging has removed residual deposition gas from the reaction chamber, moving the exhaust valve so that the reaction chamber is open to the second path and the reaction chamber and the second path are completely closed to the first path; and then opening the gate valve to remove the substrate from the reaction chamber so that if pressure fluctuations should occur when the gate valve is opened, deposition gas particles in the first path are blocked from flowing upstream into the reaction chamber.

6. In a vapor deposition system comprising a substrate handling system having a handling chamber, and a substrate processing system having a deposition chamber, and a gate valve between the two chambers, a method for controlling exhaust gas flow from the deposition chamber, said method comprising the steps of:

conducting purge gas through said deposition chamber;

opening said gate valve to move a substrate between the handling chamber and the deposition chamber;

conducting purge gas through said handling chamber at a pressure balanced fairly closely with the pressure of the deposition chamber, but with the deposition chamber pressure being slightly less than that of the handling chamber when the gate valve is open so that particles in the deposition chamber do not flow into the handling chamber;

closing the gate valve;

conducting deposition gas adjacent a substrate in said deposition chamber;

directing deposition chamber exhaust gas through a first exhaust path so long as deposition gases are flowing through the deposition chamber;

preventing exhaust gas from flowing through the first exhaust path when the gate valve is open to move a substrate into or out of the deposition chamber so that if pressure fluctuations occur in the deposition chamber, particles in the first exhaust path are blocked from flowing upstream into the deposition chamber;

providing a second exhaust path which is connected to an exhaust outlet of said deposition chamber and separated from the first path so that gas from the first path cannot enter the second path; and directing exhaust gas from the deposition chamber through the second exhaust path to the exclusion of the first exhaust path before the deposition chamber is opened to permit a substrate to be moved into or out of the chamber, and wherein the distance between the exhaust paths and said chamber exhaust outlet is minimized.

7. The method of claim 6, including the step of directing exhaust gas through said second path whenever the gas is noncontaminating.

8. The method of claim 6, wherein said directing steps are performed by a three-way valve connected to the exhaust outlet from the deposition chamber to direct the exhaust gas to one or the other of the exhaust paths.

9. The method of claim 8, including mounting said three-way valve directly to said exhaust outlet.

10. The method of claim 6, including the step of directing exhaust gas to said second path whenever purge gas flows through said chamber and contaminating gas has been substantially removed from the chamber.

11. The method of claim 6 wherein said directing steps are performed by at least one valve mounted directly to said outlet.

* * * * *

UNITED STATES PATENT AND TRADEMARK OFFICE
CERTIFICATE OF CORRECTION

PATENT NO. : 6,572,924 B1 Page 1 of 1
DATED : June 3, 2003
INVENTOR(S) : Halpin

It is certified that error appears in the above-identified patent and that said Letters Patent is hereby corrected as shown below:

<u>Column 6,</u>
Line 35, please replace "fist" with -- first --.
Line 38, please replace "front" with -- from --.

Signed and Sealed this

Thirteenth Day of April, 2004

JON W. DUDAS
*Acting Director of the United States Patent and Trademark Office*